(12) United States Patent
Lee

(10) Patent No.: US 7,458,781 B2
(45) Date of Patent: Dec. 2, 2008

(54) RADIATION FAN DRIVING APPARATUS

(75) Inventor: Vincent Lee, Hsin Tien (TW)

(73) Assignee: Zippy Technology Corp., Taipei Hsien (TW)

(*) Notice: Subject to any disclaimer, the term of this patent is extended or adjusted under 35 U.S.C. 154(b) by 564 days.

(21) Appl. No.: 10/865,917

(22) Filed: Jun. 14, 2004

(65) Prior Publication Data
US 2005/0275992 A1 Dec. 15, 2005

(51) Int. Cl.
*F04B 49/00* (2006.01)

(52) U.S. Cl. .............................. 417/18; 417/2

(58) Field of Classification Search ............ 417/2, 417/18; 307/64; 361/103; 340/584; 363/141, 363/144
See application file for complete search history.

(56) References Cited

U.S. PATENT DOCUMENTS 5,969,436 A * 10/1999 Chalasani et al. ............. 307/64
6,098,175 A * 8/2000 Lee ............................ 713/320
6,163,087 A    12/2000 Huang et al.
7,088,565 B2 * 8/2006 Watanabe et al. ........... 361/103
2007/0097721 A1 * 5/2007 Chou ......................... 363/141
2007/0150236 A1 * 6/2007 Warizaya .................... 702/184

FOREIGN PATENT DOCUMENTS

TW    400968    8/2000

* cited by examiner

*Primary Examiner*—William H Rodríguez
(74) *Attorney, Agent, or Firm*—Muncy, Geissler, Olds & Lowe, PLLC

(57) ABSTRACT

A radiation fan driving apparatus aims to allow a non-stop power supply system to output electric power to drive a radiation fan to continuously rotate at a lower speed to perform heat dissipation even the power supply device is electrically connected to an external electric power source. A control circuit and isolation protective elements are provided so that when the main power source of a computer host is ON, the power supply device delivers electric power through the main power system or the control circuit to the radiation fan to rotate at high speed to provide optimal heat dissipation effect.

7 Claims, 5 Drawing Sheets

RADIATION FAN DRIVING APPARATUS

FIELD OF THE INVENTION

The present invention relates to a radiation fan driving apparatus and particularly to an electric power management apparatus for a power supply device or radiation fans in a computer host.

BACKGROUND OF THE INVENTION

A computer host generally has a power supply device to filter wave, rectify current and transform voltage of an external electric power source (AC 110V or 220V power source), then out the electric power to various electronic devices (such as main board, hard disk, optical disk, etc.) of the host. As electric transformation will generate thermal energy, the power supply device or computer host usually is equipped with a radiation fan to disperse heat and lower the temperature. The electric power of the radiation fan also is supplied by the main power system of the power supply device. Thus when the host is power off, the power supply device stops connecting to the external power supply. The main power system also is OFF, and the radiation fan stops operation. However, the power supply device accumulates high temperature inside after operation and the temperature cannot drop immediately. This will cause damage of electronic elements after a prolonged period of time. Moreover, the non-stop power supply system still provides electric power to the main board and control switches to maintain required operations even after the main power system is shut down. These operations also generate heat. Due to the host usually is installed in a semi-closed environment, and the host location often is hidden and closed, the heat energy cannot be dispersed. This also affects other electronic elements.

The applicant has proposed a radiation fan power off deferring apparatus in U.S. Pat. No. 6,163,087 to remedy the aforesaid problems so that after the power supply of the host is shut down (REMODE OFF), the non-stop power supply system will supply electric power to the radiation fan to continue operation to disperse the heat of the host.

SUMMARY OF THE INVENTION

In order to solve the problems occurred to the conventional power supply devices, the present invention aims to provide another technique that has the non-stop power supply system and the radiation fan connected electrically so that the non-stop power supply system provides electric power to the radiation fan to operate continuously even when the power supply device and the external electric power source is connected and power on.

Another object of the invention is to provide an isolation protective element (diode) between the non-stop power supply system, the main power system and the radiation fan so that when the power supply of the radiation fan is OFF (REMODE OFF), the non-stop power supply system supplies electricity to the radiation fan to rotate at a lower speed. When the power supply is ON (REMODE ON), the main power system outputs electricity to the radiation fan to enable the radiation fan to rotate at high speed and increase heat dissipation effect.

Yet another object of the invention is to include a control circuit to provide mainly two functions:

1. When the power supply is OFF, raise the temperature setting for the power supply device or the host higher than the original setting by taking into account of the closed environment so that the control circuit increases electric power output of the non-stop power supply system to allow the radiation fan to operate at a higher rotation speed to increase heat dissipation effect.
2. When the main power system is power OFF, as the internal temperature of the power supply device is still high, the main power system outputs a power off signal to the control circuit to increase the electric power output of the non-stop power supply system so that the radiation fan may operate at a higher rotation speed to increase heat dissipation effect.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
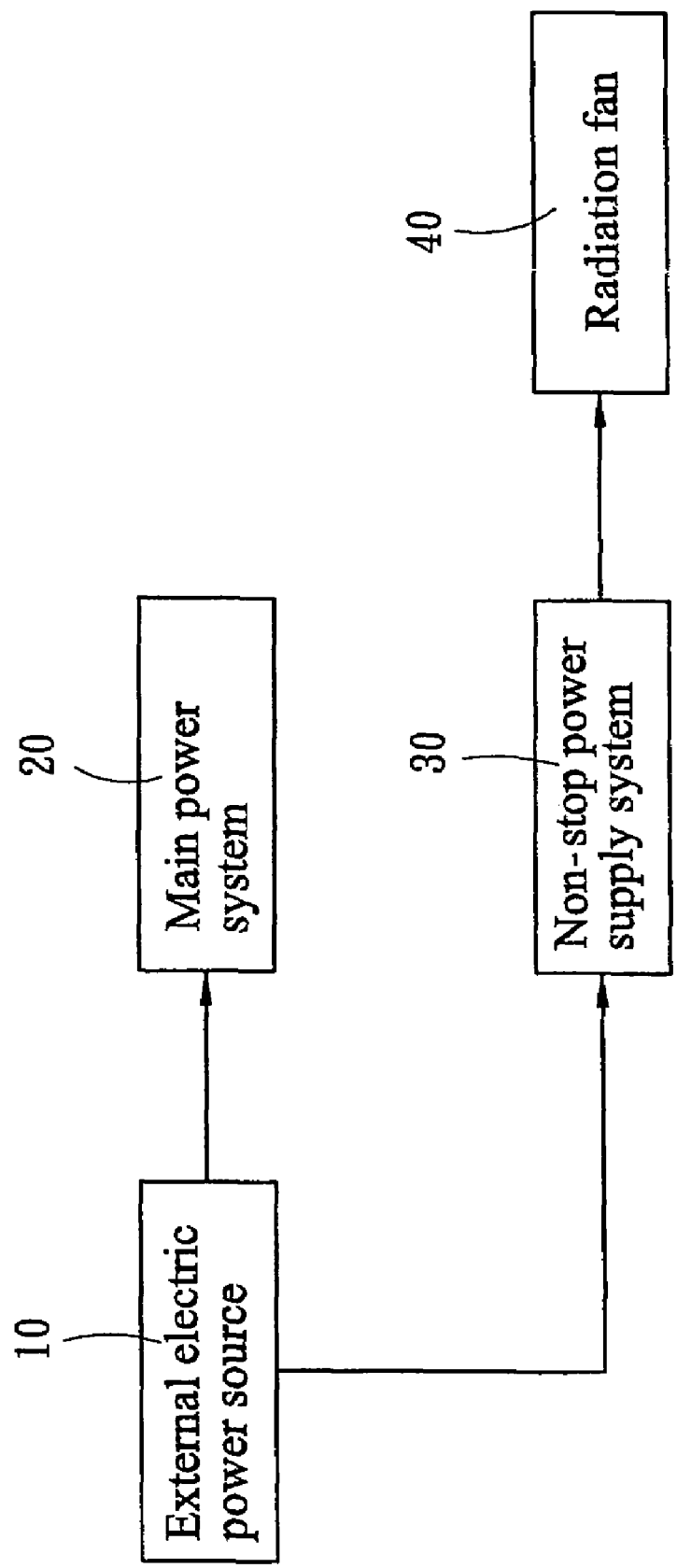
FIG. 1 is a block diagram of a first embodiment of the invention with a radiation fan and a non-stop power supply system connecting electrically.

Please refer to FIG. 1 for a first embodiment of the invention with a radiation fan 40 and a non-stop power supply system 30 connecting electrically. It is adopted for a small power supply device. The power supply device includes a main power system 20 and the non-stop power supply system 30 that connect electrically to an external electric power source 10. The non-stop power supply system 30 is connected to the radiation fan 40. Whether the main power system 20 is ON (REMODE ON) or OFF (REMODE OFF) when the external electric power source 10 is power on, the non-stop power supply system 30 outputs electric power to the radiation fan 40 to continue operation. Hence it provides heat dissipation effect for the host even in the idle condition.

Figure 2:
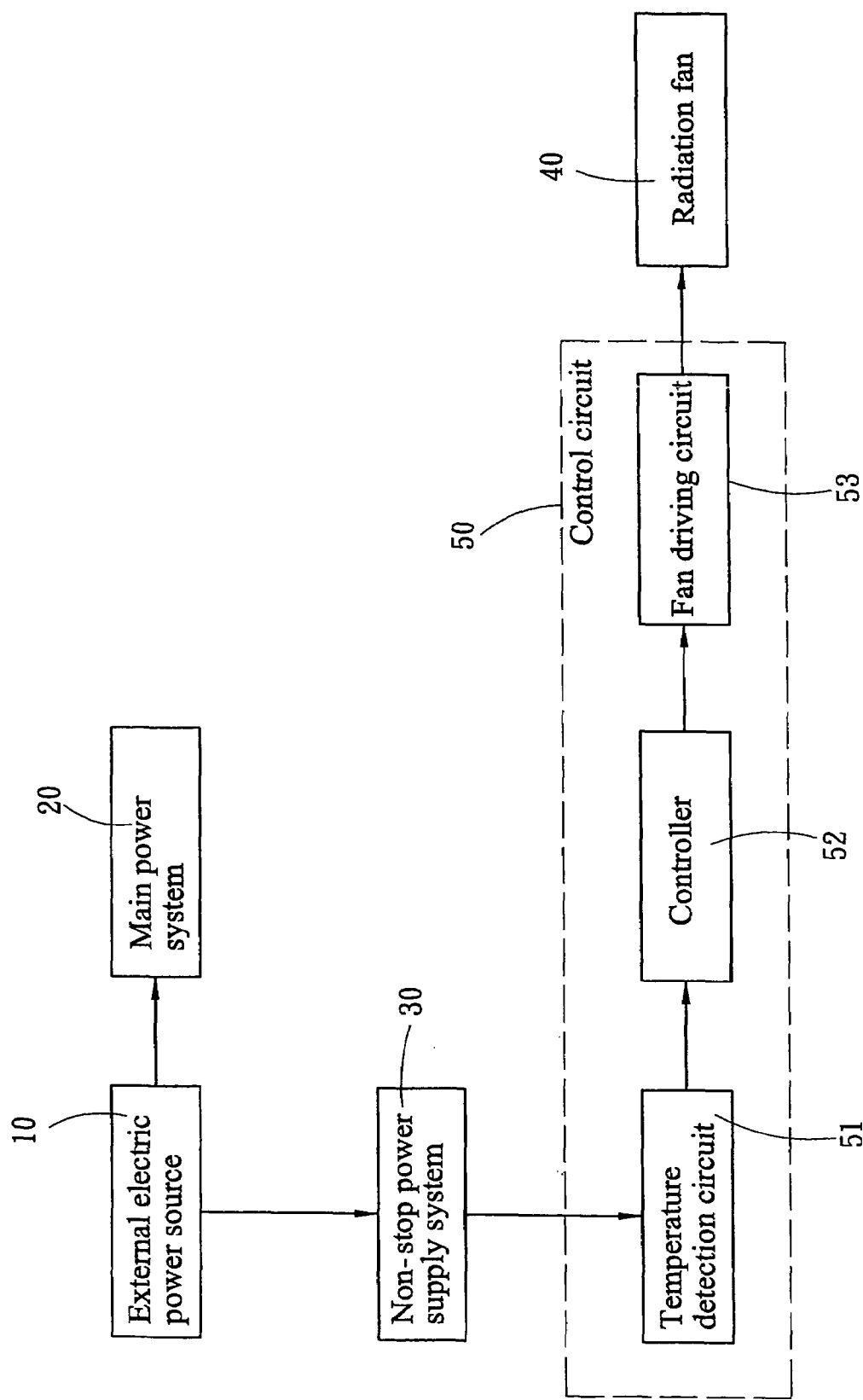
FIG. 2 is a block diagram of a second embodiment of the invention with a radiation fan, a non-stop power supply system and a control circuit connecting electrically.

Refer to FIG. 2 for a second embodiment of the invention with the radiation fan 40, the non-stop power supply system 30 and a control circuit 50 connecting electrically. It differs from the first embodiment by including the control circuit 50 between the non-stop power supply system 30 and the radiation fan 40. The control circuit 50 includes:

a temperature detection circuit 51 to detect the ambient temperature inside the power supply device and compare the ambient temperature with a setting temperature. When the ambient temperature is higher than the setting temperature, an overheated signal is output. When the ambient temperature is lower than the setting temperature, a low temperature signal is output;

a controller 52 to receive the overheated or low temperature signal from the temperature detection circuit 51, and output a driving signal; and a fan driving circuit 53 to receive the driving signal from the controller 52, and determine the electric power to be output from the non-stop power supply system 30 to the radiation fan 40 for operation.

This embodiment mainly aims to continuously supply electric power from the non-stop power supply system 30 when the power supply of the host is OFF (REMODE OFF). In the event that the temperature of the host or power supply device increases and is higher than the setting temperature due to the closed environment or peripheral devices, the temperature detection circuit 51 of the control circuit 50 outputs an overheated signal to the controller 52 to deliver a driving signal to boost the voltage of the fan driving circuit 53 and increase electric output to the radiation fan 40 so that the radiation fan 40 rotates at a higher speed to disperse heat.

Figure 3:
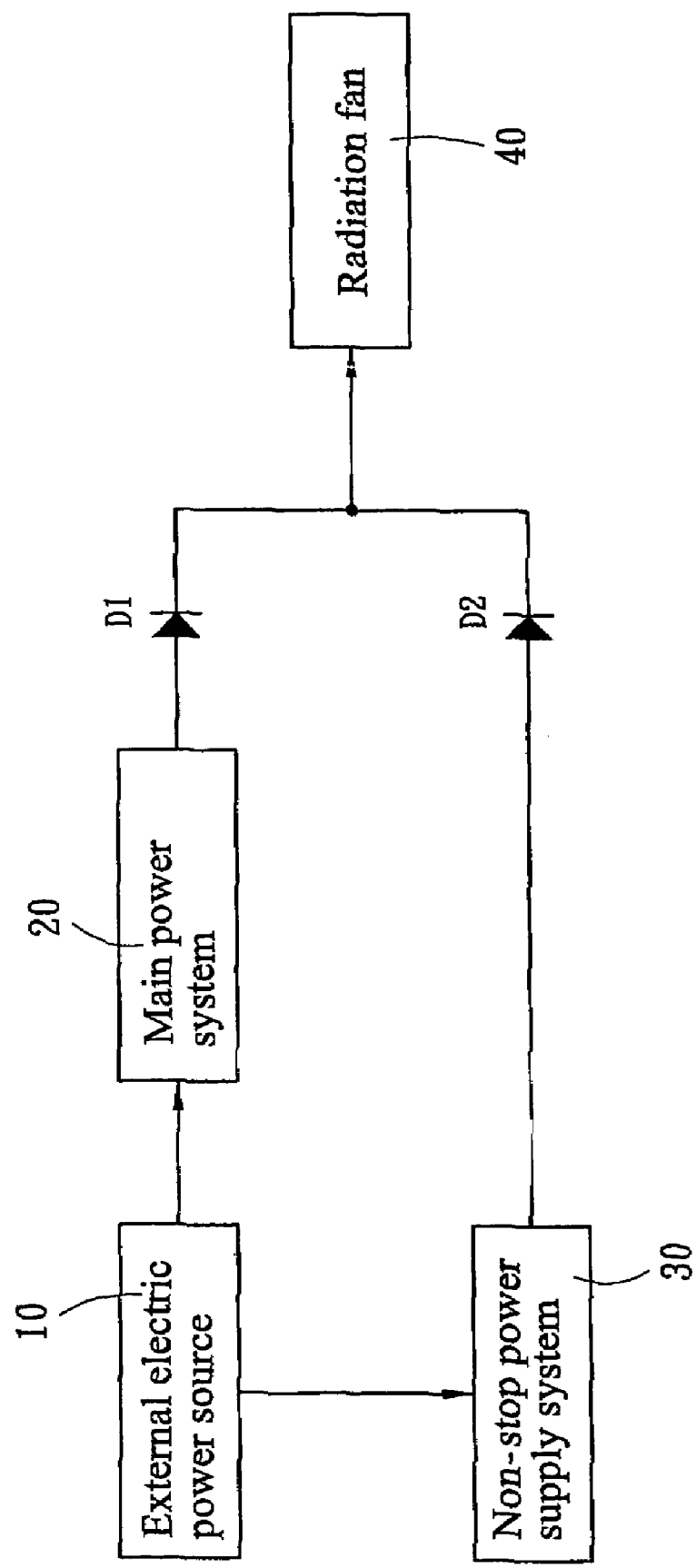
FIG. 3 is a block diagram of a third embodiment of the invention with a radiation fan, a main power system, a non-stop power supply system, and isolation protective elements connecting electrically.

Refer to FIG. 3 for a third embodiment of the invention with the radiation fan 40, the main power system 20, the non-stop power supply system 30 and isolation protective elements D1 and D2 connecting electrically. In this embodiment, besides electric connection between the external electric power source 10 and the main power system 20 and the non-stop power supply system 30, a first isolation protective element D1 is located between the main power system 20 and the radiation fan 40, and a second isolation protective element D2 is located between the non-stop power supply system 30 and the radiation fan 40. When the external electric power source 10 is ON and the main power system also is ON (REMODE ON), the isolation protective elements D1 and D2 formed by diodes allow the main power system 20 to provide operational electricity to the radiation fan 40. When the main power system 20 is OFF, the non-stop power supply system 30 immediately outputs electric power to the radiation fan 40 to maintain continuous operation.

Figure 4:
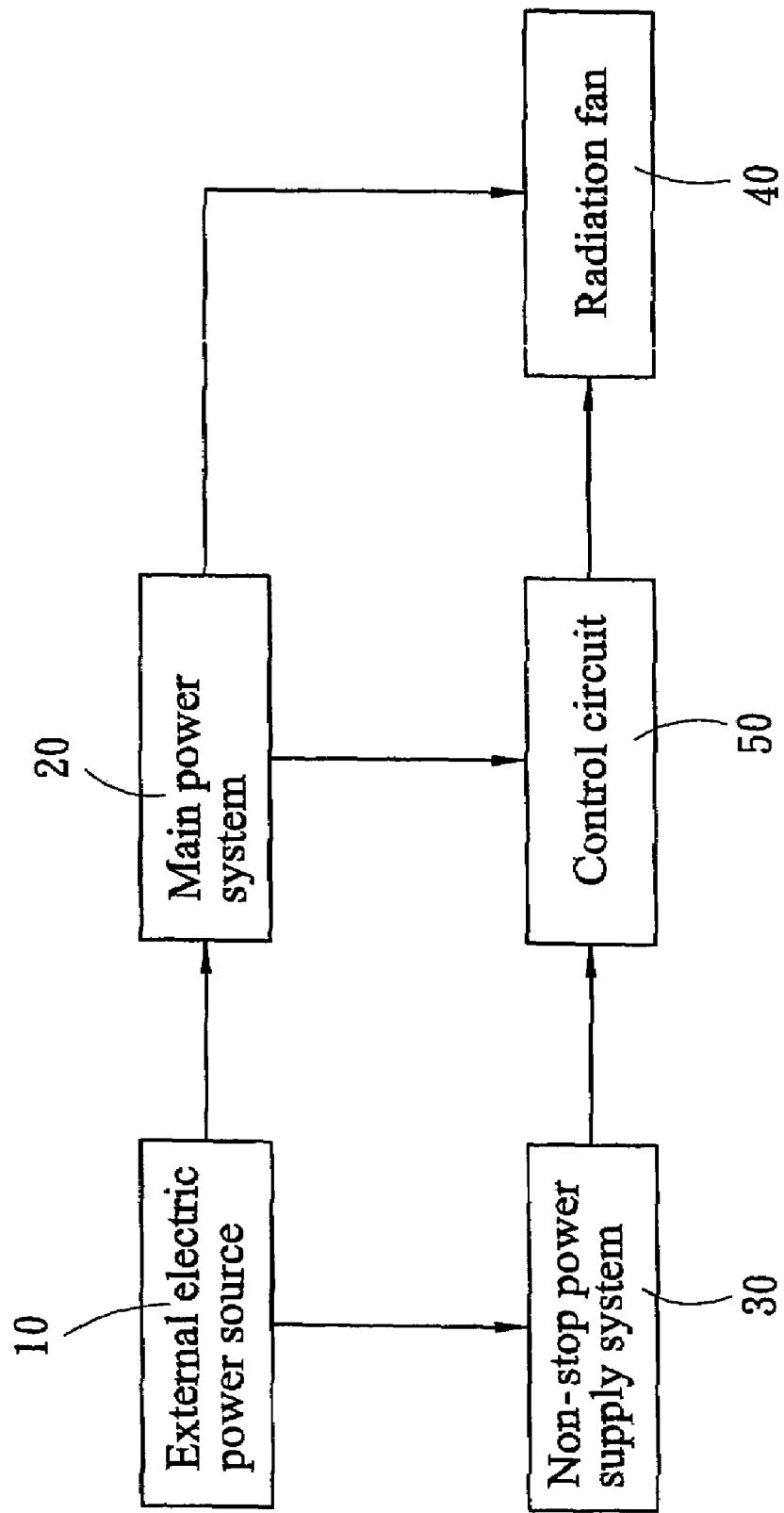
FIGS. 4 and 5 are block diagrams of a fourth embodiment of the invention with a radiation fan, a main power system, a non-stop power supply system, a control circuit and isolation protective elements connecting electrically.
Figure 5:
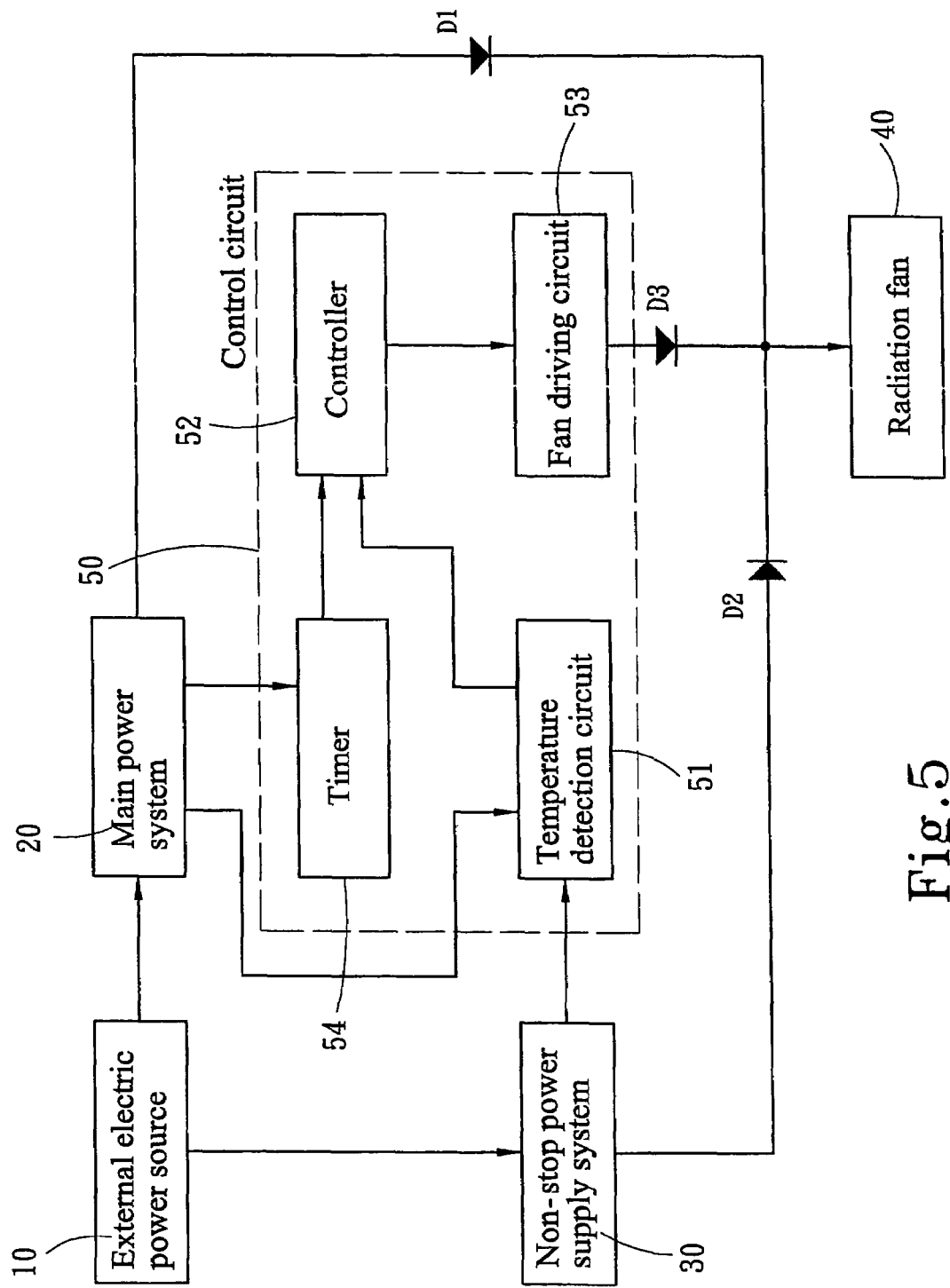

Refer to FIGS. 4 and 5 for a fourth embodiment of the invention with the radiation fan 40, main power system 20, non-stop power supply system 30, control circuit 50 and isolation protective elements D1, D2 and D3 connecting electrically. This embodiment combines the functions of the previous three embodiments. The driving apparatus of the radiation fan 40 includes:

the main power system 20 being electrically connected to the external electric power source 10 to output a first driving signal. It also is connected to a control switch (not shown in the drawings) to set the main power system 20ON or OFF to output the first driving signal;

the non-stop power supply system 30 being electrically connected to the external electric power source 10 to output a second driving signal;

the control circuit 50 receiving the first and the second driving signals from the main power system 20 and the non-stop power supply system 30 to output an actuation signal. The control circuit 50 includes:

a timer 54 to receive a power OFF signal from the main power system 20 and output a timing signal;

a temperature detection circuit 51 to detect the ambient temperature inside the power supply device and compare the ambient temperature with a setting temperature. When the ambient temperature is higher than the setting temperature, an overheated signal is output. When the ambient temperature is lower than the setting temperature, a low temperature signal is output;

a controller 52 to receive the timing signal from the timer 54 and the overheated or low temperature signal from the temperature detection circuit 51, and output a driving signal; and a fan driving circuit 53 to receive the driving signal from the controller 52, and determine the electric power to be output from the non-stop power supply system 30 to the radiation fan 40 for operation.

When the main power system 20 is OFF (REMODE OFF), it outputs a power OFF signal to the control circuit 50 to transform the actuation signal to the second driving signal, and makes the external electric power source 10 to deliver electricity through the non-stop power supply system 30 to the radiation fan 40 for operation. Meanwhile the non-stop power supply system 30, depending on the determination of the temperature detection circuit 51 which detects the ambient temperature, outputs a desired voltage to alter the rotation speed of the radiation fan 40.

When the main power system 20 is ON (REMODE ON), it outputs a power ON signal to the control circuit 50 to transform the actuation signal to the first driving signal, and makes the external electric power source 10 to deliver electricity through the main power system 20 to the radiation fan 40 for operation.

When the main power system 20 switches from the ON condition to the OFF condition (REMODE OFF), it outputs a power OFF signal to the timer 54 or transforms the actuation signal to the second driving signal by directly referring to the ambient temperature detected by the temperature detection circuit 51, and makes the external electric power source 10 to deliver electric power through the non-stop power supply system 30 to the radiation fan 40 to operate in a time period preset by the timer 54 or according to the reaction resulting from the detected temperature.

In the fourth embodiment, the isolation protective elements D1, D2 and D3 formed by diodes are interposed respectively between the radiation fan 40 and the main power system 20, the non-stop power supply system 30 and the control circuit 50 to determine the input voltage and operational speed of the radiation fan 40.

What is claimed is:

1. A radiation fan driving apparatus comprising:
    a radiation fan;
    a main power system; and
    means for delivering electric power to the radiation fan to operate continuously when an external electric power source is ON whether the main power supply is ON or OFF;
    said main power system and said means for delivering electric power connecting electrically to the external electric power source;
    the radiation fan connecting to the main power system and the means for delivering electric power.

2. The radiation fan driving apparatus of claim 1, wherein the main power system and the means for delivering electric power are connected respectively to the radiation fan through an isolation protective element.

3. The radiation fan driving apparatus of claim 1, wherein the means for delivering electric power and the radiation fan are electrically connected through a circuit.

4. The radiation fan driving apparatus of claim 3, wherein the control circuit includes:
    a temperature detection circuit to detect the ambient temperature inside a power supply device and compare the ambient temperature with a setting temperature, and output an overheated signal when the ambient temperature is higher than the setting temperature, and output a low temperature signal when the ambient temperature is lower than the setting temperature;
    a controller to receive the overheated or the low temperature signal from the temperature detection circuit and output a driving signal; and a fan driving circuit to receive the driving signal from the controller and determine electric power to be output from the means for delivering electric power to the radiation fan for operation.

5. The radiation fan driving apparatus of claim 1, wherein the main power system and the means for delivering electric power are connected electrically and respectively to the radiation fan through a control circuit.

6. The radiation fan driving apparatus of claim 5, wherein the control circuit includes:

a timer to receive a power off signal from the main power system and output a timing signal;

a temperature detection circuit to detect the ambient temperature inside a power supply device and compare the ambient temperature with a setting temperature, and output an overheated signal when the ambient temperature is higher than the setting temperature, and output a low temperature signal when the ambient temperature is lower than the setting temperature;

a controller to receive the timing signal from the timer and the overheated or the low temperature signal from the temperature detection circuit and output a driving signal; and a fan driving circuit to receive the driving signal from the controller and determine electric power to be output from the means for delivering electric power to the radiation fan for operation.

7. The radiation fan driving apparatus of claim 5, wherein the main power system, the means for delivering electric power and the control circuit are connected respectively to the radiation fan through an isolation protective element.

* * * * *